US010673119B2

(12) United States Patent
Stewart et al.

(10) Patent No.: US 10,673,119 B2
(45) Date of Patent: Jun. 2, 2020

(54) HIGHLY DIRECTIVE ELECTROMAGNETIC COUPLER WITH ELECTRICALLY LARGE CONDUCTOR

(71) Applicant: Raytheon Company, Waltham, MA (US)

(72) Inventors: Kelly Ryian Stewart, Tucson, AZ (US); Matthew Salem, Tucson, AZ (US); Matthew J. Wargo, Tucson, AZ (US); Joseph M. Anderson, Tucson, AZ (US)

(73) Assignee: RAYTHEON COMPANY, Waltham, MA (US)

( * ) Notice: Subject to any disclaimer, the term of this patent is extended or adjusted under 35 U.S.C. 154(b) by 24 days.

(21) Appl. No.: 15/789,288

(22) Filed: Oct. 20, 2017

(65) Prior Publication Data
US 2019/0123415 A1   Apr. 25, 2019

(51) Int. Cl.
*H01P 5/18* (2006.01)
*H01P 3/08* (2006.01)
*H05K 1/11* (2006.01)

(52) U.S. Cl.
CPC ............... *H01P 5/184* (2013.01); *H01P 3/08* (2013.01); *H01P 5/185* (2013.01); *H05K 1/115* (2013.01)

(58) Field of Classification Search
CPC .................................. H01P 5/18; H01P 5/184
USPC .................................................. 333/109, 116
See application file for complete search history.

(56) References Cited

U.S. PATENT DOCUMENTS

| 5,012,209 | A | * | 4/1991 | Lantagne | ................ | H01P 5/185 333/116 |
| 5,576,669 | A | * | 11/1996 | Ruelke | ...................... | H01P 5/18 333/116 |
| 7,075,387 | B2 | * | 7/2006 | Paakkonen | ............. | H01P 5/185 333/116 |
| 7,151,421 | B2 | * | 12/2006 | Shinabe | .................. | H01P 5/185 333/116 |
| 7,400,214 | B2 | | 7/2008 | Storniolo et al. | | |
| 2011/0291770 | A1 | | 12/2011 | Cisco et al. | | |
| 2012/0105170 | A1 | | 5/2012 | Noori et al. | | |

FOREIGN PATENT DOCUMENTS

JP   S62130001 A   6/1987
WO   9933139 A2   7/1999

OTHER PUBLICATIONS

Notification of Transmittal of the International Search Report and the Written Opinion of the International Searching Authority, or the Declaration; PCT/US2018/046596; dated Nov. 16, 2018, 13 pages.

* cited by examiner

*Primary Examiner* — Dean O Takaoka
(74) *Attorney, Agent, or Firm* — Cantor Colburn LLP

(57) ABSTRACT

A directional coupler includes a substrate, an output line formed on a top of the substrate, and an input line formed on the top of the substrate and including a transmission region. The coupler also includes a lower input line formed on a bottom of the substrate below at least a portion of the transmission region, and one or more vias passing through the substrate and electrically coupling the input line and the lower input line.

10 Claims, 6 Drawing Sheets

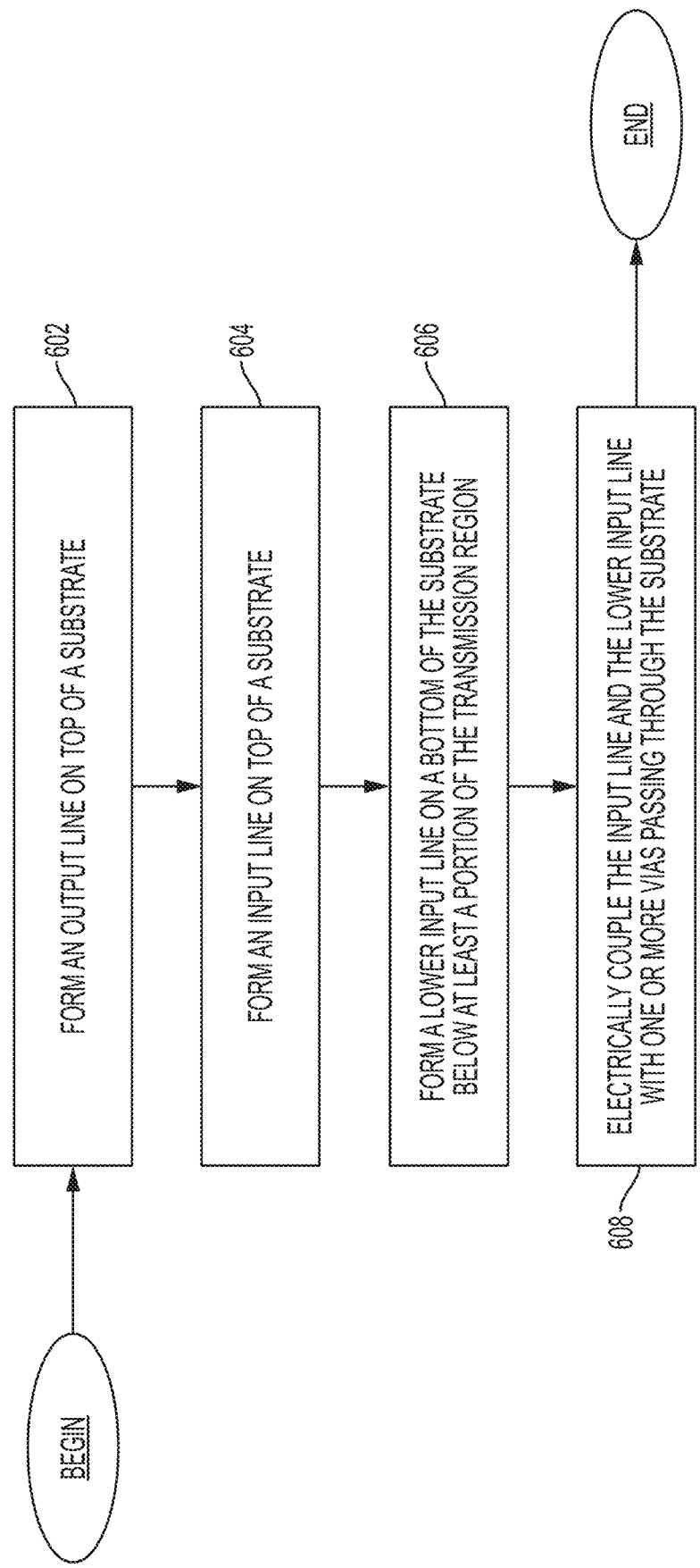

HIGHLY DIRECTIVE ELECTROMAGNETIC COUPLER WITH ELECTRICALLY LARGE CONDUCTOR

GOVERNMENT LICENSE RIGHTS

This invention was made with Government support under contract number N00024-15-C-5420 awarded by the Naval Sea Systems Command. The government has certain rights in the invention.

BACKGROUND

The subject matter disclosed herein relates to couplers and, in particular, to an electromagnetic directional coupler having an electrically large coupler.

FIG. 1 shows a top view of an example coupler 100 and is presented to explain the general operation of the embodiments disclosed herein. In the coupler 100 an input signal is coupled from an input line 104 to an output line 106. Both input and output lines 104,106 may be formed of any type of conductive material such as, for example, a wire or metallic trace. The body 102 of the coupler 100 can be formed of a silicon substrate onto which other elements/layers described below are formed over.

The input signal (shown by arrow 112) provided at an input port 110 is partially transmitted along input line 104 to a transmitted port 114. The transmitted signal received at the transmitted port 114 is shown by arrow 116.

A portion of the power received at the input port 110 may be coupled to an output (or coupled) port 120. The output port 120 may be directly connected by a metal connection to the isolated port 118 to form output line 106. In normal naming context, the input port 110 may be called port 1, transmitted port 114 may be called port 2, output port 120 may be called port 3, and isolated port 118 may be called port 4.

The power incident upon input port 110 is partially coupled to output port 120. The ratio of the power at the output port 120 (of signal shown by arrow 122) to the power at the input port 110 is referred to as the coupling ratio. If a lossless condition is assumed, then the signal splitting losses are 3 dB on both termination port 114 and output port 120. That is, the power of input signal 112 is split into two parts with the power at output port 120 and termination port 114 both being one half the power of the input signal. Of course, due to non-ideal impedance matching and dielectric losses the coupling factor may be below (worse than) 3 dB, but nevertheless power (signal) is coupled from input port 110 to the output port 120.

In space-limited locations, couplers may need to be limited in length in the region where coupling is to occur. To that end, in some instances, rather than the configuration shown in FIG. 1, the coupler 100 may take on more complicated shape.

BRIEF DESCRIPTION

Disclosed herein is a directional coupler that includes a substrate, an output line formed on a top of the substrate and an input line formed on the top of the substrate and including a transmission region. The coupler also includes a lower input line formed on a bottom of the substrate below at least a portion of the transmission region and one or more vias passing through the substrate and electrically coupling the input line and the lower input line.

In any embodiment disclosed herein, the transmission region includes a near field region that is closer to the output line than other portions of the input line.

In any embodiment disclosed herein, the lower input line may include a lower nearfield line formed on the bottom of the substrate below the near field line and electrically coupled by at least one of the one or more vias to the near field line.

In any embodiment disclosed herein, the coupler can further include an input transmission feed line contacting both the input line and near field region.

In any embodiment disclosed herein, the coupler can further include an output transmission feed line contacting both the input line and near field region.

In any embodiment disclosed herein, the input transmission line and the output transmission line can be parallel to one another.

In any embodiment disclosed herein, the input transmission line and the output transmission line can be perpendicular to the nearfield region.

In any embodiment disclosed herein, the lower input line can include a lower output feed line formed on the bottom of the substrate below the output feed line and electrically coupled by at least one of the one or more vias to the output feed line.

In any embodiment disclosed herein, the lower input line can include a lower input feed line formed on the bottom of the substrate below the input feed line and electrically coupled by at least one of the one or more vias to the input feed line.

In any embodiment disclosed herein, the coupler can further include a lower output line formed on the bottom of the substrate below the output line and electrically coupled by at least one of the one or more vias to the output line.

In any embodiment disclosed herein the transmission region can include a near field region that is closer to the output line than other portions of the input line.

In any embodiment disclosed herein the lower input line can include a lower nearfield line formed on the bottom of the substrate below the near field line and electrically coupled by at least one of the one or more vias to the near field line.

In any embodiment disclosed herein, the lower input line and the output line are all formed of metal traces.

According to one embodiment, a method of forming a directional coupler is disclosed. The method includes: forming an output line on a top of a substrate; forming an input line on the top of the substrate, the input line including a transmission region; forming a lower input line on a bottom of the substrate below at least a portion of the transmission region; and electrically coupling the input line and the lower input line with one or more vias passing through the substrate.

In one embodiment, the vias are formed before at least one of the input line and the lower input line.

BRIEF DESCRIPTION OF THE DRAWINGS

The following descriptions should not be considered limiting in any way. With reference to the accompanying drawings, like elements are numbered alike:

FIG. 6 is flow chart of a method of forming a directional coupler.

DETAILED DESCRIPTION

Figure 1:
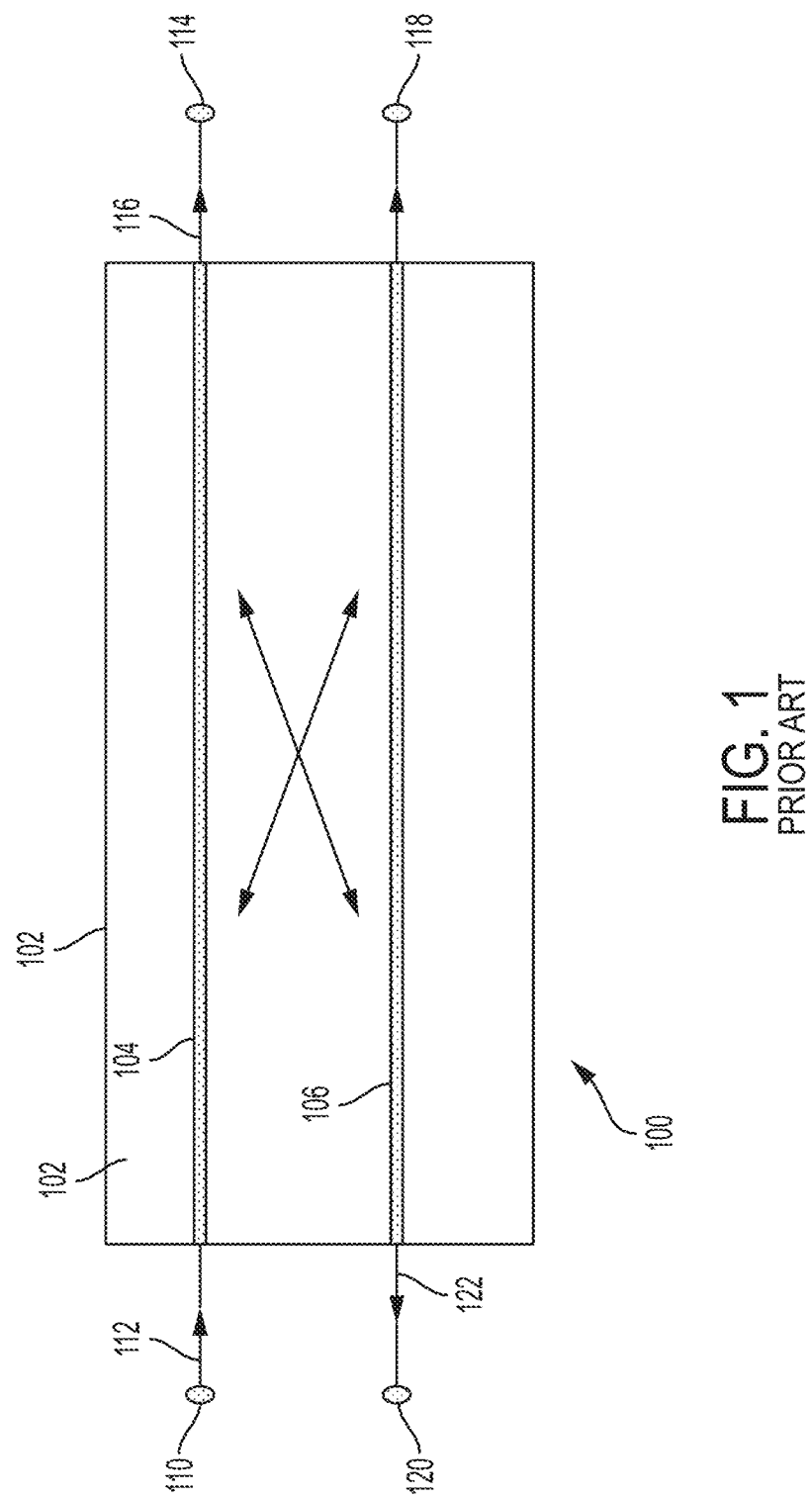
FIG. 1 is a top view of an example prior art electromagnetic or directional coupler.

A detailed description of one or more embodiments of the disclosed system, apparatus and method are presented herein by way of exemplification and not limitation with reference to the Figures.

As discussed above, in space-limited locations, couplers may need to be limited in length in the region where coupling is to occur. An example of such a configuration in a limited space is shown in the electromagnetic coupler 200 (coupler) illustrated in FIG. 2. The coupler 200 includes an input line 202 and an output line 204. In general, a signal provided on input line 202 is coupled onto the output line 204. The region where this occurs is in the transmission region generally shown as region 206. In the transmission region 206 the input line 202 is generally closer to the output line 204 than in other locations of the coupler.

It shall be understood that while the terms "input" and "output" line are used herein that does not serve to limit transmission from only input line 202 to output line 204. Accordingly, in one embodiment a signal provided on the output line 204 is coupled to the input line 202. However, for clarity, in the following discussion a signal is generally provided on the input line 202 and coupled to the output line 204. In one embodiment, the signal provided on the input line is a built in test (BIT) used to test the reception of an antenna or antenna array. As such, it shall be understood that while not limiting, the output line 204 can optionally be coupled to one or both of an antenna control electronics 240 and an antenna element 242 that may be part of an antenna array 244. Of course, the antenna element 242 could be an individual element and not part of an array.

Each of the input and output lines 202, 204 can be formed as metal or metal containing traces. As illustrated, the traces forming the input and output lines 202, 204 are formed at least on a top 220 of a substrate 208. The substrate 208 can be any type of material on which printed circuit boards (PCB) or EM couplers may be formed. Examples include a PCB that includes silicon or other dielectric materials. The substrate 208 also includes a bottom 222 that is opposite the top 220.

Outside of the transmission region 206, the input and output lines 202, 204 are separated from each other by a line separation distance 216.

In the transmission region 206, the input line 202 includes at least three regions, a first region 210, a second region 212 and a third region 214. The first and third regions 210, 214 extend in directions that are generally parallel to one another and the second region 212 (also referred to as a nearfield region) extends between and connects the first and third regions 210, 214 to each other in a direction that is substantially perpendicular to one or both of the first and third regions 210, 214. In the transmission region, the input line 202 is separated from the output line 204 by a gap 230, at its closest point. That gap 230 is less than the line separation distance 216 and extends between the near field region 212 and the output line 204 in one embodiment. In one embodiment, the near field region 210 and the output line 204 are generally perpendicular to one another for at least portion (or all) of the length (L; see FIG. 3) of the near field region 212. The first and third regions 210, 214 may also be referred to input and output transmission region feed lines 210, 214.

As illustrated, the input line 202 is narrower than the output line 204. This is by way of example only and not limiting. That is, the input and output lines could be same width or the output line 204 could be narrower than the input line 202 in other embodiments.

In prior art systems in space-limited locations, the length of the cross or nearfield region 212 can be limited to short as ⅛ the wavelength of the input signal. In such cases, the directivity of the coupler (as measured from input line 202) can be limited to less than 10 dB.

An example application of the electromagnetic coupler disclosed herein is an element of an antenna array. In one example, the coupler 200 can be used to couple a built in test (BIT) signal from the input line 202 to the output line 204. In such an example, the output line 204 could be a strip line that connects to a patch antenna such as antenna 244. Of course, the teachings herein are not so limited. As disclosed herein, the coupler 200 includes an increased amount of metal in at least a portion of the transmission region 230 may increase directivity.

In one embodiment, the coupler described herein utilizes a multilayer trace connected by vias to form an electrically large conductor. This forces a larger percentage of even and odd mode energy to propagate in air. This may overcome the effects of the substrate causing differences in even and odd mode velocities of propagation which results in low directivity.

As used herein, a via is hole that passes through a circuit board or substrate and that includes metal therein to electrically connect elements on either side of the substrate to one another. The metal can be electroplated into the holes or by lining the hole with a metallic tube or rivet or by other known means.

Figure 2:
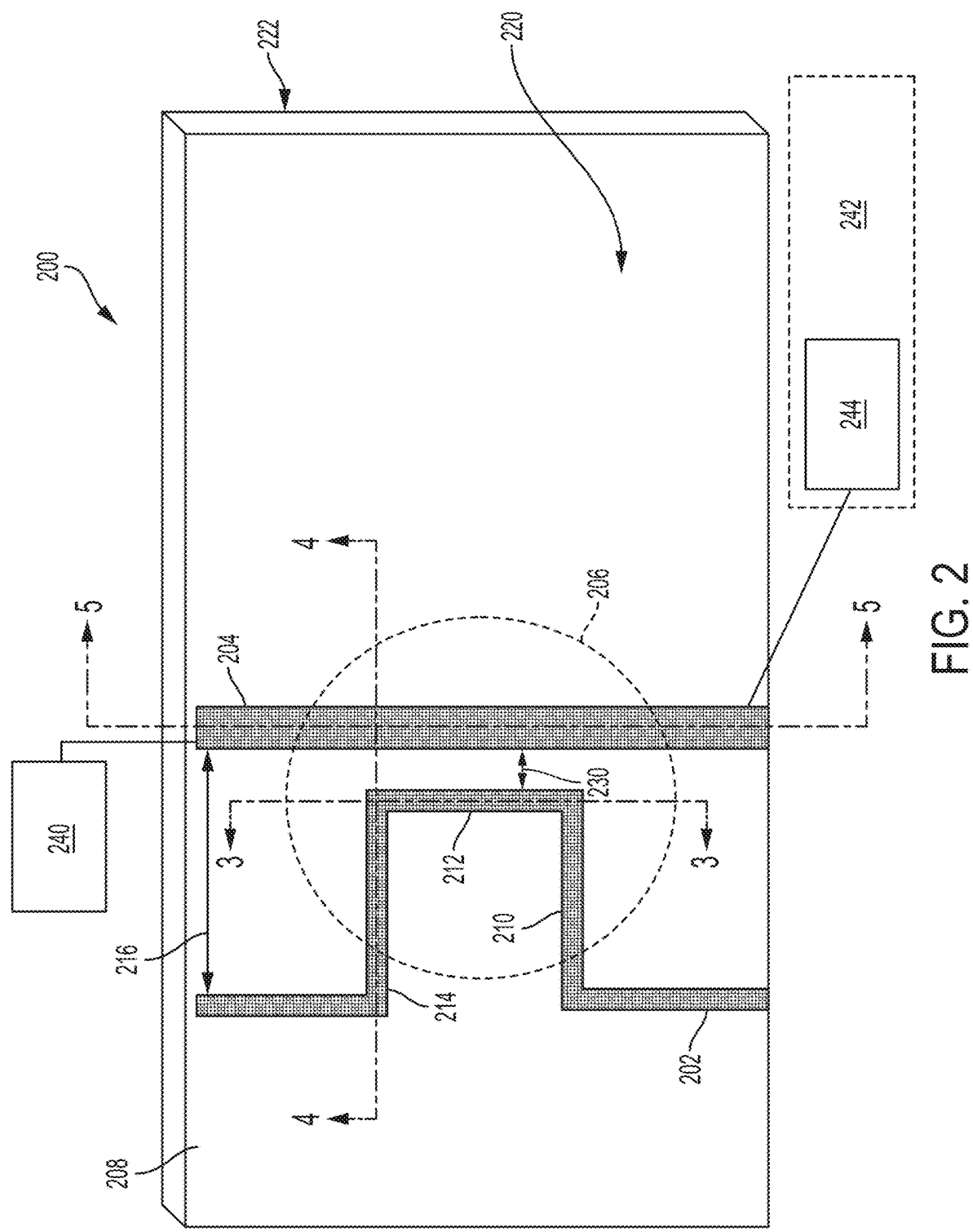
FIG. 2 is a top view of a coupler according to one embodiment.
Figure 3:
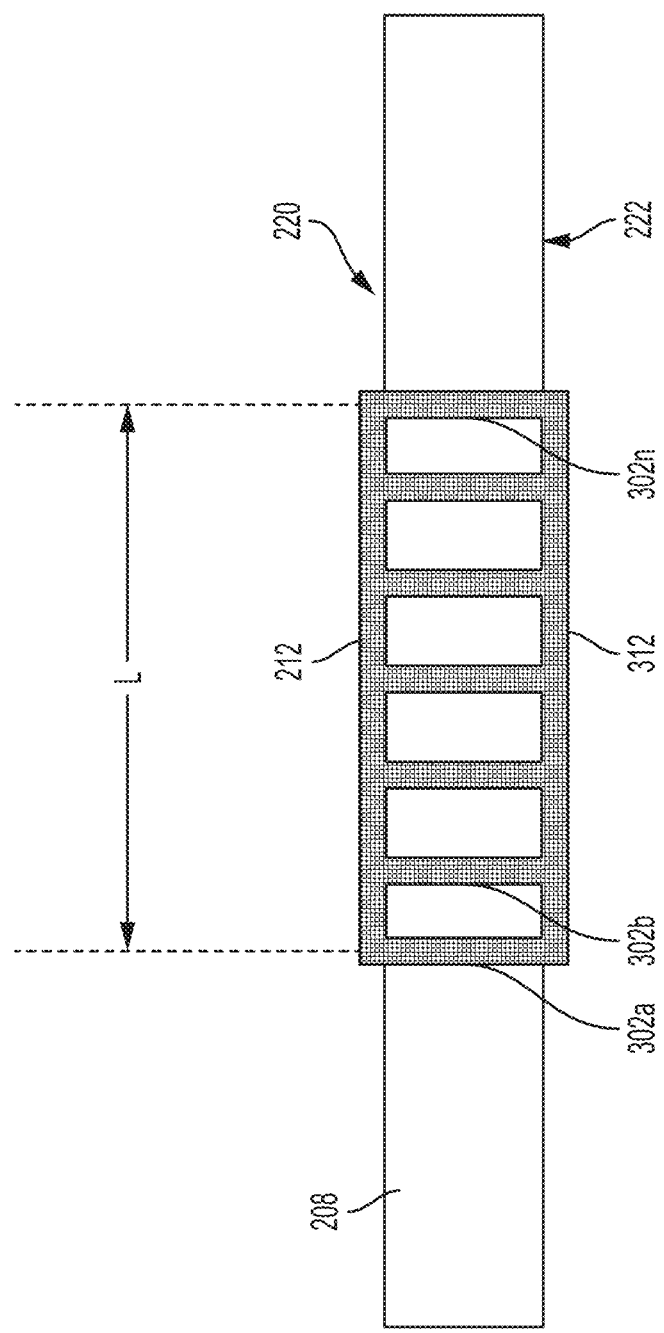
FIG. 3 shows a cross section of FIG. 2 taken along line 3-3.

FIG. 3 shows a cross-section of FIG. 2 taken along line 3-3. The input line 202 includes the near field region 212 that is deposited on the top 220 of the substrate 208. One or more vias 302a to 302n pass through the substrate 208 and electrically connect the near field region 212 with lower near field line 312 that is disposed on the bottom 222 of the substrate 208. The number of vias 302 provided can be any number and the locations and spacing between them can be selected based on particular requirements. Each additional via adds more metal to the nearfield region 212 effectively making the near field region more directive. As shown, the length of the near field region 212 and the lower near field line 312 are the same but that is not required. While the term "line" is used herein, it shall be understood that the term "trace" can be interchanged with the term "line" depending on the context.

Figure 4:
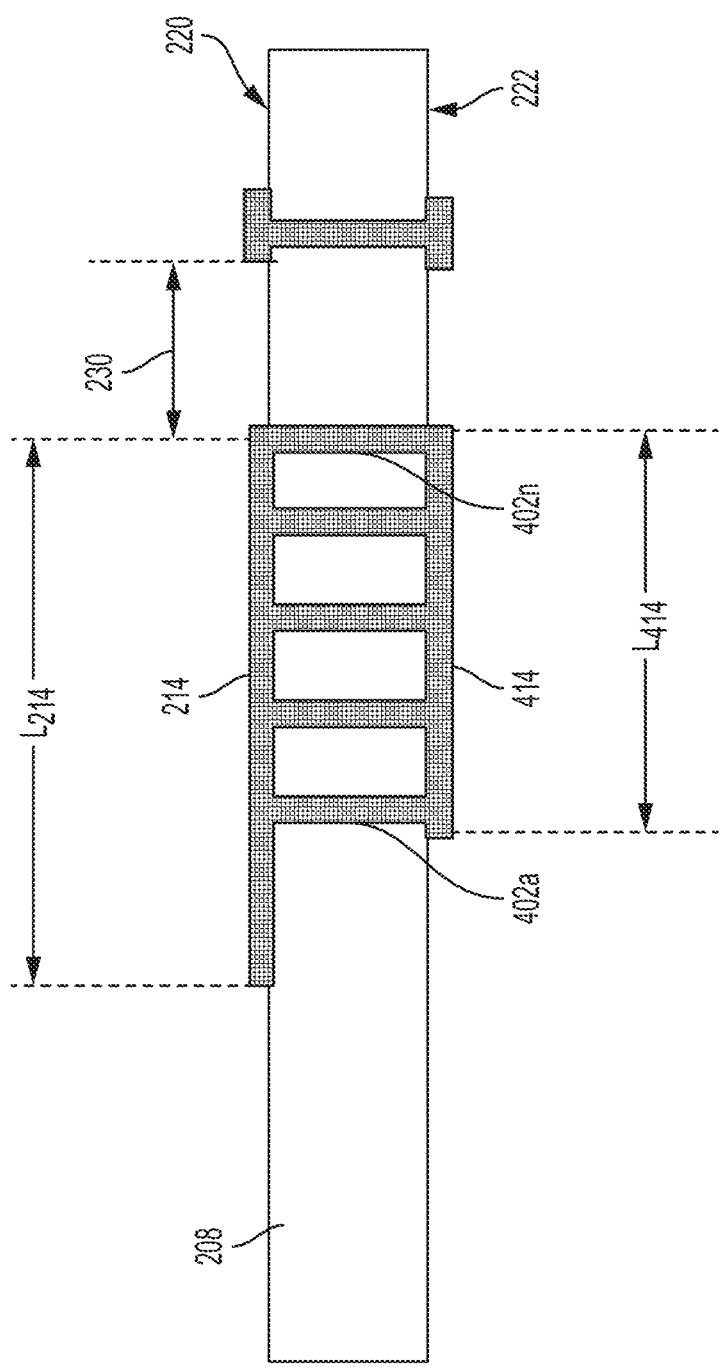
FIG. 4 shows a cross section of FIG. 2 taken along 4-4.

With reference again to FIG. 2, similar to the near field region 212, one or both the transmission region feed lines can include a lower transmission feed line disposed on an opposite side of the substrate and electrically coupled to the transmission region feeds 210/214. This is shown in FIG. 4 which is a cross-section taken along line 4-4. It shall be understood that while FIG. 4 shows output transmission region feed line 214 (or feed line 214), the same or similar structure can also be applied to the input transmission feed line 210.

In more detail, the input line 202 includes the feed line 214 that is deposited on the top 220 of the substrate 208. One or more vias 402a to 402n pass through the substrate 208 and electrically connect the feed line 214 and lower input feed line 414 that is disposed on the bottom 222 of the substrate 208. The number of vias 402 provided can be any number and the locations and spacing between them can be selected based on particular requirements. Each additional via adds more metal to the feed line 214 As shown, the length $L_{214}$ of the feed line 214 is greater than the length $L_{414}$ of the lower input feed line 414 but that is not required. In one embodiment, $L_{214}$ and $L_{414}$ can be the same or $L_{414}$ can be longer that $L_{214}$.

Figure 5:
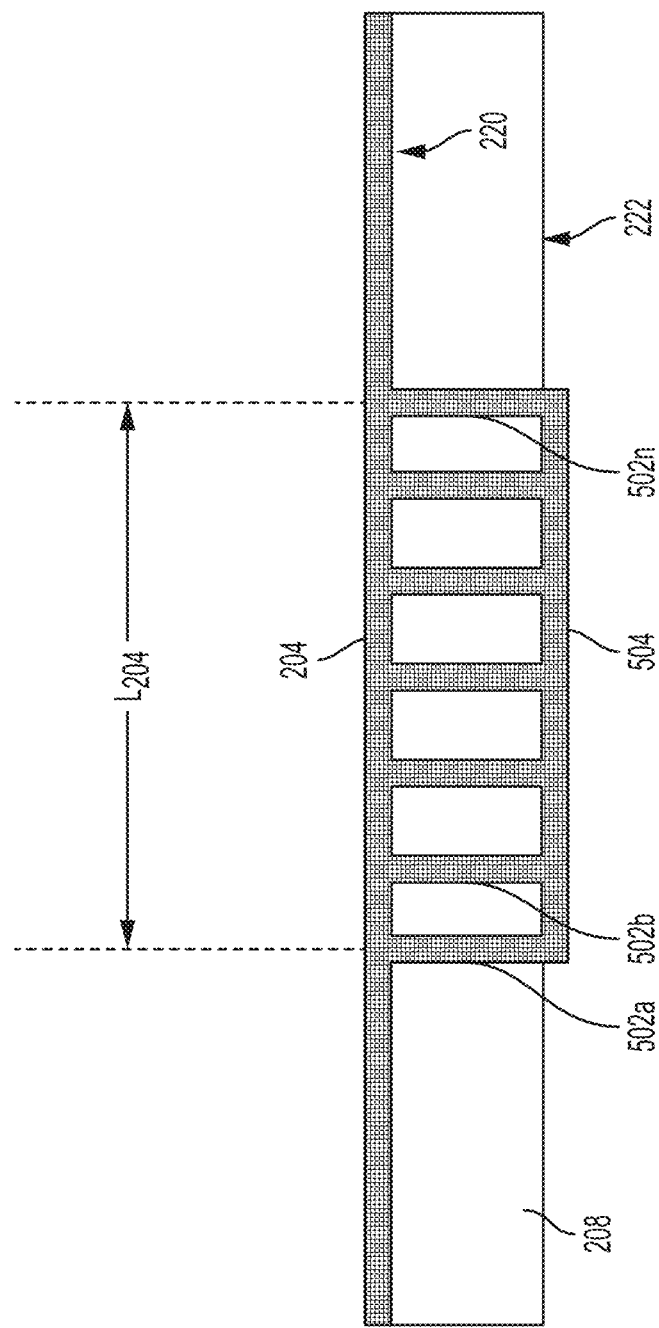
FIG. 5 shows a cross section of FIG. 2 taken along 5-5.

With reference again to FIG. 2, the output line 204 can include a lower output line 504 disposed on an opposite side of the substrate and electrically coupled to the. This is shown in FIG. 5 which is a cross-section taken along line 5-5.

In more detail, the output line 204 has a length $L_{204}$ and is deposited on the top 220 of the substrate 208. One or more vias 502a to 502n pass through the substrate 208 and electrically connect the output line and lower output line 504 that is disposed on the bottom 222 of the substrate 208. The number of vias 502 provided can be any number and the locations and spacing between them can be selected based on particular requirements. Each additional via adds more metal to the output line 504. As shown, the length $L_{204}$ of the output line is equal to the length of the lower output line 504 but that is not required. In one embodiment, $L_{204}$ and $L_{212}$ (FIG. 2) can be the same but that is not required.

FIG. 6 is flow chart showing method of forming a directional coupler according to one embodiment. It shall be understood that any of the elements described above can added to method of FIG. 6 whether expressly recited or not.

At block 602 the method includes forming an output line on a top of a substrate.

At block 604 the method includes forming an input line on the top of the substrate. The input line includes a transmission region as described above.

At block 606 the method includes forming a lower input line on a bottom of the substrate below at least a portion of the transmission region.

At block 608 the method includes electrically coupling the input line and the lower input line with one or more vias passing through the substrate. In one embodiment, the vias are formed before at least one of the input line and the lower input line.

One skilled in the art will recognize that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A directional coupler comprising:
    a substrate;
    an output line formed on a top of the substrate;
    an input line formed on the top of the substrate and including a transmission region, the transmission region including input and output transmission lines connected to a near field region, wherein the input and output transmission lines are perpendicular to the output line and the near field region is parallel to the output lines;
    a lower input line formed on a bottom of the substrate below at least a portion of the transmission region; and
    one or more vias passing through the substrate and electrically coupling the input line and the lower input line;
    wherein the substrate is continuous between the input line and the output line.

2. The directional coupler of claim 1, wherein the transmission region includes a near field region that is closer to the output line than other portions of the input line.

3. The directional coupler of claim 2, wherein the lower input line includes a lower nearfield line formed on the bottom of the substrate below the near field line and electrically coupled by at least one of the one or more vias to the near field line.

4. The directional coupler of claim 1, wherein the lower input line includes a lower output feed line formed on the bottom of the substrate below the output feed line and electrically coupled by at least one of the one or more vias to the output feed line.

5. The directional coupler of claim 1, wherein the lower input line includes a lower input feed line formed on the bottom of the substrate below the input feed line and electrically coupled by at least one of the one or more vias to the input feed line.

6. The directional coupler of claim 1, further comprising:
    a lower output line formed on the bottom of the substrate below the output line and electrically coupled by at least one of the one or more vias to the output line.

7. The directional coupler of claim 1, wherein the lower input line includes a lower nearfield line formed on the bottom of the substrate below the near field line and electrically coupled by at least one of the one or more vias to the near field line.

8. The directional coupler of claim 1, wherein the input line, the lower input line and the output line are all formed of metal traces.

9. A method of forming a directional coupler, the method comprising:
    forming an output line on a top of a substrate;
    forming an input line on the top of the substrate, the input line including a transmission region, the transmission region including input and output transmission lines connected to a near field region, wherein the input and output transmission lines are perpendicular to the output line and the near field region is parallel to the output lines;
    forming a lower input line on a bottom of the substrate below at least a portion of the transmission region; and
    electrically coupling the input line and the lower input line with one or more vias passing through the substrate;
    wherein the substrate is continuous between the input line and the output line.

10. The method of claim 9, wherein the vias are formed before at least one of the input line and the lower input line.

* * * * *